United States Patent
Riera et al.

(10) Patent No.: US 12,543,298 B1
(45) Date of Patent: Feb. 3, 2026

(54) COMPOSITE POWER ELECTRONICS COVER

(71) Applicant: Zoox, Inc., Foster City, CA (US)

(72) Inventors: Luis Riera, Redwood City, CA (US); Vishveshwar Ramanathan Subramanian, Palo Alto, CA (US)

(73) Assignee: Zoox, Inc., Foster City, CA (US)

( * ) Notice: Subject to any disclaimer, the term of this patent is extended or adjusted under 35 U.S.C. 154(b) by 358 days.

(21) Appl. No.: 18/104,221

(22) Filed: Jan. 31, 2023

(51) Int. Cl.
*H05K 7/20* (2006.01)
*H02K 11/33* (2016.01)
*H05K 5/03* (2006.01)
*H05K 9/00* (2006.01)

(52) U.S. Cl.
CPC .......... *H05K 7/209* (2013.01); *H02K 11/33* (2016.01); *H05K 5/03* (2013.01); *H05K 9/0007* (2013.01)

(58) Field of Classification Search
CPC .. H05K 7/209; H05K 7/2089; H05K 7/20845; H05K 7/20854; H05K 9/0007; H05K 5/03; H02K 11/33
See application file for complete search history.

(56) References Cited

U.S. PATENT DOCUMENTS

| | | | | |
|---|---|---|---|---|
| 4,980,516 | A * | 12/1990 | Nakagawa | H05K 9/0015 174/358 |
| 5,847,317 | A * | 12/1998 | Phelps | H05K 9/003 174/370 |
| 8,564,732 | B2 * | 10/2013 | Zhou | H05K 7/2099 349/61 |
| 9,029,204 | B2 * | 5/2015 | Horimoto | H04R 31/00 438/459 |
| 9,115,707 | B2 * | 8/2015 | Hattori | H02K 11/33 |
| 9,699,538 | B2 * | 7/2017 | Liu | H04R 1/04 |
| 10,779,445 | B2 * | 9/2020 | Chung | H05K 7/20927 |
| 11,076,503 | B2 * | 7/2021 | Korta | H05K 7/20445 |
| 2003/0161109 | A1 * | 8/2003 | Kurihara | H01L 21/565 257/E23.092 |
| 2013/0329367 | A1 * | 12/2013 | Huang | H05K 7/20445 361/704 |
| 2021/0243922 | A1 * | 8/2021 | Takahashi | H05K 7/20927 |
| 2022/0338391 | A1 * | 10/2022 | Bastistella | H05K 7/20872 |
| 2023/0219506 | A1 * | 7/2023 | Wang | B32B 3/30 181/200 |
| 2024/0121922 | A1 * | 4/2024 | Chong | H05K 7/209 |

* cited by examiner

*Primary Examiner* — Jayprakash N Gandhi
*Assistant Examiner* — Matthew Sinclair Muir
(74) *Attorney, Agent, or Firm* — Lee & Hayes, P.C.

(57) ABSTRACT

A system for vibration reducing covers for electrical components. The system includes composite covers for electronic components of drive units to reduce vibrations and associated noise during operation of a vehicle. The cover is formed of a composite to dampen oscillations occurring as a result of vibrations from the drivetrain of the vehicle. The cover also includes a thermal pathway for transferring energy as heat from an interior of compartment containing the electronic components to an environment outside the cover. Additionally, the cover can include an electromagnetic interference and/or radio frequency interference shield to prevent interference with other electronic components on and/or nearby the vehicle during operation.

20 Claims, 7 Drawing Sheets

COMPOSITE POWER ELECTRONICS COVER

BACKGROUND

Electric vehicles are becoming more and more prevalent. These vehicles include hybrid vehicles, such as the extended range electric vehicles (EREV) that combine a battery and a main power source, such as an internal combustion engine, fuel cell system, etc., and electric only vehicles, such as the battery electric vehicles (BEV). All of these different types of electric vehicles may employ battery systems and electronic drive units.

BRIEF DESCRIPTION OF THE DRAWINGS

The detailed description is described with reference to the accompanying figures. In the figures, the left-most digit of a reference number identifies the figure in which the reference number first appears. The same reference numbers in different figures indicate similar or identical items.

DETAILED DESCRIPTION

This disclosure relates to drive units, and in particular, to composite covers for electronic components of drive units to reduce vibrations and associated noise during operation of a vehicle. The cover can be formed of a composite to dampen oscillations occurring as a result of vibrations from the drivetrain of the vehicle. The cover may also be less expensive to form or manufacture than comparable metal covers and may also provide additional or improved electrical insulation for isolating the components within the covers from the environment as well as preventing the components from influencing items outside the cover. The cover can also include a thermal pathway for transferring energy as heat from an interior of compartment containing the electronic components to an environment outside the cover. As composites are typically poor thermal conductors, the cover can include a heat sink or other low thermal impedance thermal pathway to transfer heat energy through the composite material forming the cover and/or thermal dissipating features. The thermal pathway may include active and/or passive heat transfer mechanisms, for example including passive convection to a surrounding environment and/or active cooling via a pumped fluid (e.g., liquid or gas) transfer or forced air convection. Additionally, the cover can include an electromagnetic interference and/or radio frequency interference shield to prevent interference with other electronic components on and/or nearby the vehicle during operation. The shield may be included to increase or enhance electromagnetic shielding since composite materials typically provide limited effectiveness as electromagnetic interference shields. The mechanism can include an EMI shielding interface between a thermal pathway and EMI shielding features of the composite cover.

In electrically powered vehicles, an electronic drive unit may include an electric motor, power electronics unit, and enclosure for the power electronics unit. In some examples, the electronic drive unit may include a gearbox and/or differential as part of the drivetrain. In some examples the power electronics unit may include an inverter and/or a direct-current (DC) to DC converter. The electronic drive unit may receive power from a battery, hydrogen cell, capacitor, ultracapacitor, generator, or other energy production and/or storage device of the vehicle as direct current and the power inverter outputs an alternating current signal to power the electric motor for the vehicle. The electronic drive unit may also receive power from an alternating current source and power the motor using the power from the source. During travel and/or operation of the vehicle, the drivetrain (e.g., an electromechanical motor or similar device) or other components of the vehicle may cause vibrations and/or oscillations through the electronic drive unit. In some examples, the electronic drive unit may also be a source of vibrations. In typical drive units, a metal cover such as an aluminum or steel cover can resonate with the vibrations of the electric motor and/or the drivetrain of the vehicle. The vibration causes the cover, typically a large, thin, flat surface to resonate and create a great amount of noise similar to a speaker resonator.

Battery and electronic drive units, as well as other electrically powered components on an electric vehicle typically include steel or aluminum covers that can provide a number of functions. For example, the cover can be a protective cover in that it prevents the battery cells and/or electronic drive units from being damaged as a result of collision with other objects. Further, the cover can provide electrical insulation from the high voltage of the battery to protect individuals and users. Also, the cover can provide an EMI/RFI shield that absorbs radiation over a broad range of wavelengths from the high voltage battery and/or electronic drive units caused by turning on and off various current flows, which otherwise could interfere with various signals in and around the vehicle. Covers for vehicle components are typically steel or aluminum covers that provide the necessary structural integrity to protect the components and provide the EMI/RFI shielding. However, such covers are typically easily resonated by vibrations of the electronic drive units, geartrains, or other components of the vehicle, contributing significant noise to operation of the vehicle.

The composite cover for the electronic components as described herein employs a material such as a plastic or other such material that has a higher vibration damping coefficient than typical materials such as aluminum or steel and thereby reduces the resonation and vibration of the cover resulting in the volume of noise and potential continued oscillations that may be felt through the vehicle. In some examples, the material may have a mechanical damping coefficient, or other such property that reduces vibration and resonation of the cover. The composite cover may, for example, have a damping coefficient (e.g., a measure of how rapidly the oscillations decay from one bounce to the next) significantly higher than comparable metal covers. The plastic, polymer, or other composite may reduce the vibrations, oscillations, and resonances from the cover as a result of changing the material of the cover in addition to structural adjustments described herein that provide improved performance and reduced wear for vehicle components as well as reduced noise and volume during operation of the vehicle. A composite cover may also have weight and/or cost advantages over an equivalent metal cover.

In some examples, the composite cover may be formed from a suitable material, such as a nylon, reinforced acrylonitrile butadiene styrene (ABS), ABS, carbon fiber, thermoset plastics, high density polyethylene, low density polyethylene, polycarbonate, polyoxymethylene, acrylic poly methyl methacrylate (PMMA), thermoplastic polyurethane, thermoplastic rubber, polypropylene, or other such materials. In some examples, the composite cover may be injection molded with component formed integrally therein, such as a heat sink or thermal pathway. In some examples, the composite cover may be formed of a composite material with wire mesh, fibers, powders, or other such materials mixed and/or suspended and/or integrated with one or more plastic materials to form the composite cover. The wire mesh, fibers, powders, and other such materials may provide electromagnetic interference shielding, improve strength, reduce vibrations, increase a damping coefficient, and/or otherwise alter the properties of the composite cover. Additionally, the inclusion of wire mesh, fibers, or other such strengthening materials within the cover may aid in protection of electrical components during a collision event and prevent items from protruding through the cover.

In some examples, the cover may be injection molded or formed from plastic or other such materials that enables more complex geometries that would otherwise not be possible or would be cost prohibitive for other materials, such as aluminum or steel covers.

In some examples, the composite cover may include structural elements such as ribs, fillets, fins, supports, and other such geometry to increase the stiffness of the composite cover. In some examples, the cover may have a corrugated shape or other such geometry to increase a stiffness of the cover and thereby reduce the effects of vibration on the composite cover. The composite cover may also include layers of various different conductive materials for electromagnetic shielding, strength, and vibration damping. In an example, the composite cover may include a portion, such as a center portion, that includes a rubber, elastomeric, or other vibration absorbing material for vibration damping as the inclusion of such materials within the composite cover may increase a damping ratio or coefficient for the composite cover.

The composite cover also includes shielding for electromagnetic and radio frequency interference. The composite cover may include a shielding component, such as a metallic coating, electrically conductive coating, paint, and/or a metal layer or component that functions as an electromagnetic shielding component. In some examples, the electrically conductive coating may include an electrically conductive paint, such as a metallic paint comprising nickel, copper, silver, or other materials (e.g., graphite) that may be bound with adhesives to adhere to the cover. The coating may include vapor deposited metallic layers such as a copper-chrome-nickel vapor deposition layer or an aluminum vapor deposition layer. In some examples, the metallic layer may include a lacquer comprising a metal, such as a conductive lacquer mixed with nickel, copper, silver, carbon (graphite), or other such materials. In some examples, the metallic layer may be plasma deposited or otherwise deposited on the cover, for example on an interior surface of the cover. In some examples, the metallic component for shielding may be suspended in and/or distributed through a plastic forming the composite cover. For instance, a thermoplastic may be injection molded to form the cover, and the thermoplastic may include granules, bits, or pieces of metals that will be distributed through the final cover to provide electromagnetic shielding. The metal layer may be sandwiched between layers of composites and/or adhered to a composite layer on one side such that the metal layer serves to shield components from electromagnetic interference.

The composite cover and housing together may surround the components with electromagnetic shielding to prevent electromagnetic interference from passing into and/or out of the housing. The composite cover, and the metallic layer may extend across an inner surface of the composite cover and extend to edges of the composite cover. The composite cover and housing may interface through a gasket or other materials that may be sandwiched between the composite cover and the housing when assembled. In some examples, the gasket may include conductive materials and/or be formed of a conductive material such that the electromagnetic shielding from the housing and the composite cover is continuous, to prevent leakage of electromagnetic signals through the boundary between the composite cover and the housing. In some examples, the composite cover, and more specifically the metallic layer, may be electrically coupled with the housing, such that the electromagnetic shielding may be electrically grounded or otherwise at a single potential level.

In some examples, the composite cover can further include a thermal pathway integrated through the cover to enable cooling, either actively or passively, for circuitry and/or electrical components within the enclosure. For instance, in a drive unit, the electrical components may include an inverter and/or resistor network that interfaces with an electrical system of the vehicle and may generate heat during operations that may vary depending on the operation. For example, the resistor network may dissipate a spike in heat produced in a single time while an inverter may produce a consistent amount of heat energy during normal operation. The resistor network, or other components, may be included within the housing to dissipate energy provided from a battery, capacitor, or other source, for example in instances of electrical component failure or malfunction. The composite cover may transport heat from within the composite cover to outside the composite cover to dissipate to an environment and prevent thermal buildup and potential overheating of electrical components and/or decreased performance from the electrical components due to the collected heat. The composite cover can include a thermal pathway to cool the electrical components through the composite cover, thereby overcoming a shortcoming of most composites, low thermal conductivity. The thermal pathway may include a heat sink and/or active cooling channels that are integrally formed with and/or pass through a portion of the composite cover. The heat sink may extend into the space enclosed by a case and the composite cover to contact one or more heat-generating components. An opposite and/or distal end of the heat sink extends out through the composite cover to radiate heat energy into an environment outside of the enclosure. In some examples, the thermal pathway may include one or more active cooling channels, such as a block that includes fluid filled pipes that carry heat to a dissipation location such as a radiator, integrally formed within the composite cover such that cooling fluid may pass through the cover to transfer heat from components within the enclosure to a destination outside of the enclosure, such as at a heat exchanger or radiator.

As disclosed herein, composite covers may not be inherently electrically conductive and therefore may provide insufficient shielding, especially in automotive applications with stringent EMI requirements. As disclosed, features, such as the addition of conductive paint, coatings, suspended materials, etc. can improve electromagnetic shieling for electrical components of the drivetrain. Additionally, composites may be relatively poor thermal conductors and the disclosed composite cover systems may include features for a thermal path to pass through a composite cover (e.g., to allow heat generated from inside of a drivetrain to pass through a composite cover via a thermal conductor, e.g., heatsink). The disclosed systems may include features to ensure that the thermal pathway features and composite together form a sufficient electromagnetic shield for a drivetrain. For example, such a shield should be electrically coupled (e.g., with a relatively low electrical impedance between drivetrain housing, composite cover, and thermal pathway) and have minimal air gaps between these components to mitigate electromagnetic emissions from passing between such gaps. Additionally, the shielding should be grounded sufficiently to prevent such features from re-radiating electromagnetic waves.

In some examples, features can be included to sufficiently couple athermal pathway to a composite cover. In practice, a thermal pathway may first be coupled to a component of the drivetrain (e.g, a resistor, voltage regulator, etc.) and then the composite cover coupled the drivetrain housing over the thermal pathway. In examples, the thermal pathway may be a heatsink and may be substantially a metallic component (e.g., a metal heatsink optionally with fins or other features that protrude outside of the composite cover when mounted to the drivetrain). The heatsink may include a lip that may directly couple (or via an electrically conductive gasket or similar) to a metallic layer of the composite cover (e.g., a metallic coating to the inside of the composite cover). The composite cover may include fasteners to further couple the cover to the heatsink and mitigate risks with the interface being compromised form vibration or other effects. In some examples, the thermal pathway/heatsink may be directly integrated into the composite cover such that the composite cover is coupled to the drivetrain housing and the heatsink to the component (e.g., via a thermal paste or pad) as one unit. In such examples, a coating may directly be applied to the heatsink and the composite cover to form uniform shielding with the heatsink being mechanically coupled to the composite (e.g., via fasteners, over molding, etc.).

In some examples, a heatsink may include a top portion that is formed to interface with a composite cover more integrally. For example, the top portion may include fastening provisions, relatively flat surfaces, etc. As an example, the top portion may include fins or other heat dissipating features configured to protrude through corresponding openings in the cover. Between these fins/heat dissipating features may be flat portions that may rest or be coupled to the composite cover via electrically conductive sealant/adhesive/pad(s)/gasket(s) to more improve electromagnetic shielding capabilities of the cover system while enabling thermal conductive heatsinks or similar features for thermal passthrough of the cover. In some examples, the composite cover may include integrated metallic fins or other heat dissipating features that may be suspended in composite materials (e.g., via over molding or via fasteners) such that the heat dissipating features from an island of metallic material within composite material that fastens to drivetrain housing. These heat dissipating features may be positioned such that a corresponding heatsink, heat pipe, etc. couples to the heat dissipating features of the composite cover when the cover is coupled to the drivetrain. For example, a heatsink, heat pipe, or other may be coupled to a heat generating component to be housed by the composite cover. Thermal grease or a thermal pad may be applied to a top portion of the heatsink, heat pipe or similar feature such that when the composite cover is mounted to the drivetrain, the thermal grease or pad may coupled the heat sink or equivalent to the heat dissipating features of the composite cover. Optionally, fasteners may be used to mechanically couple the heat dissipating features of the cover to the heat pipe/heat sink. In this manner, the composite cover can form a monolithic structure (with metallic and composite materials) that can form a electromagnetic shield lacking gaps between the composite and metallic materials and wherein the metallic materials can act as a thermal pathway and couple to a corresponding heatsink for a drivetrain.

In some examples, the cover may include one or more additional components integrated therein, such as sensors to detect changes in temperature, pressure, electrical discharge, or other such events that may be identified and generate error codes or warnings for the vehicle system.

The systems and techniques described herein provide for covers for electrical components, such as on vehicles, that are cost-efficient, enable thermal regulation of the electrical components, prevent or reduce noise due to oscillation or vibration of the system, reduce overall weight of the system, and prevent or reduce electromagnetic or radio frequency interference from the electrical components.

Figure 1:
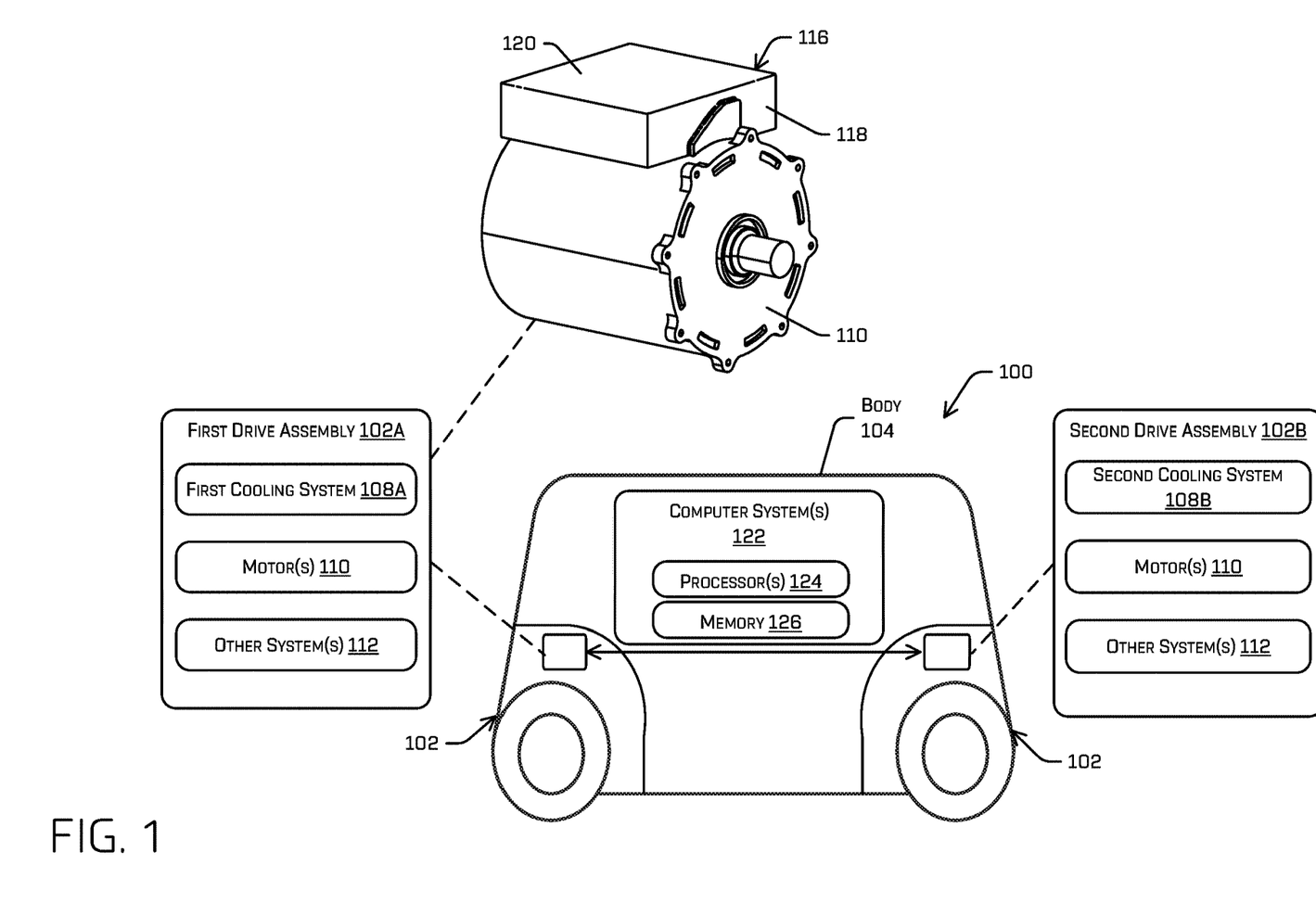
FIG. 1 illustrates an example vehicle having one or more drive assemblies using electric motors and composite covers, according to at least one example.

Turning now to the figures, FIG. 1 illustrates a vehicle 100 having one or more drive assemblies 102 using electric motors and composite covers, according to at least one example. In the illustrated example, the vehicle 100 includes a first drive assembly 102A and a second drive assembly 102B (collectively "drive assemblies 102") coupled to a body 104. Each of the drive assemblies 102 in this example includes multiple vehicle systems. For example, the first drive assembly 102A in this example includes a first cooling system 108A, and the second drive assembly 102B includes a second cooling system 108B. The first cooling system 108A and the second cooling system 108B may be referred to collectively as "cooling systems 108." Each of the drive assemblies 102 in this example also include one or more motor(s) 110 and one or more other systems 112. In some examples, motor(s) 110 comprise or can be part of a propulsion system of the vehicle. By way of example and not limitation, the one or more other systems 112 may comprise a steering system, a braking system, a suspension system, related controls and actuators for the forgoing systems, electronics related to supplying power from one or more batteries to one or more other components or systems of the drive assemblies 102 and/or the body 104. In some examples, the propulsion systems may also include exterior lighting, body panels, facia, and/or sensors.

The body 104 in this example includes one or more computer systems 122 to control operation of one or more systems of the vehicle 100. For instance, in the case of an autonomous vehicle, the computer systems 122 may include one or more processors 124 and memory 126 and may be configured to control the vehicle 100 to, among other things, receive and process sensor data from one or more sensors and to plan a route for the vehicle through an environment.

Though described with respect to the vehicle 100 in the example of FIG. 1, the electrical enclosure systems described herein may be implemented in other types of vehicles including electric vehicles of all types and may be implemented in non-vehicular applications such as power storage, backup power delivery, battery packs, and other such implementations.

In some examples, the cooling systems 108 may be used to cool the electrical components of the drive assemblies 102, such as power inverters by circulating coolant from the cooling systems 108 to and/or through heat transfer devices to transfer thermal energy away from the electrical components. In some examples, the cooling systems 108 may include passive systems such as heat sinks or may include active components that push or move coolant to transfer heat. The cooling systems 108 may also be used to cool one or more other systems of the vehicle 100. For instance, in some examples the first cooling system 108A and/or the second cooling system 108B may comprise a heating ventilation and air conditioning (HVAC) system used to cool a passenger compartment of the vehicle 100. In examples, in some examples the first cooling system 108A and/or the second cooling system 108B may provide cooling to the motor(s) 110 of the first drive assembly 102A and/or the second drive assembly 102B. By way of example and not limitation, the cooling systems 108 may include one or more reservoirs, circulation systems, heat exchangers, condensers, compressors, valves, and/or controllers to provide cooling and/or thermal management to various components and/or systems of vehicle 100.

The drive assemblies 102 may include the motor(s) 110 as well as electrical components such as an inverter 116 enclosed within a case 118, the case 118 and a cover 120 configured to enclose the inverter 116 to isolate the inverter from the environment and protect it from damage. The case 118 may include a metal case that may be coupled with the drive assembly 102 such that the motor 110 and case 118 are integrally formed together. In some examples, the case 118 may be formed of a composite material, such as discussed with respect to the cover 120.

The cover 120 employs a material such as a plastic or other such material that has a higher damping coefficient than typical materials such as aluminum or steel that may form the case 118 and/or structure that supports the motor 110 and/or drive assembly 102 and thereby reduces the resonation and vibration of the cover resulting in the volume of noise and potential continued oscillations that may be felt through the vehicle 100. The cover 120 may, for example, have a damping coefficient (e.g., a measure of how rapidly the oscillations decay from one bounce to the next) significantly higher than comparable metal materials. The plastic, polymer, or other composite may reduce the vibrations, oscillations, and resonations from the cover as a result of changing the material of the cover 120 in addition to structural adjustments described herein that provide improved performance and reduced wear for vehicle components as well as reduced noise and volume during operation of the vehicle 100.

In some examples, the cover 120 may be formed from a material, such as a nylon, reinforced acrylonitrile butadiene styrene (ABS), ABS, carbon fiber, thermoset plastics, high density polyethylene, low density polyethylene, polycarbonate, polyoxymethylene, acrylic poly methyl methacrylate (PMMA), thermoplastic polyurethane, thermoplastic rubber, polypropylene, or other such materials. In some examples, the cover 120 may be injection molded with component formed integrally therein, such as a heat sink or components for the cooling system 108. In some examples, the composite cover may be formed of a composite material with wire mesh, fibers, powders, or other such materials mixed and/or suspended and/or integrated with one or more plastic materials to form the cover 120. In some examples, the cover 120 may be injection molded or formed from plastic or other such materials that enables more complex geometries that would otherwise not be possible or would be cost prohibitive for other materials, such as aluminum or steel covers.

In some examples, the cover 120 may include structural elements such as ribs, fillets, fins, supports, and other such geometry to increase the stiffness of the cover 120. In some examples, the cover 120 may have a corrugated shape or other such geometry to increase a stiffness of the cover 120 and thereby reduce the effects of vibration on the cover 120. In some examples, the structural components may be provided on the cover 120 to disrupt large planes that may vibrate and resonate during operation. In some examples, the structure of the composite cover may be designed with structural features, such as ribs, fillets, and/or supports designed to reduce vibrations or oscillations at particular frequencies, such as identified frequencies for vibrations from operation of the vehicle. The structural features, and the cover 120, may be tuned to prevent such oscillations and vibrations. The cover 120 may also include layers of various different materials for shielding, strength, and vibration damping. In an example, the composite cover may include a portion, such as a center portion, that includes a rubber material for vibration damping as the inclusion of such materials within the composite cover may increase a damping ratio or coefficient for the composite cover.

The cover 120 also includes shielding for electromagnetic and radio frequency interference. The cover 120 may include a shielding component, such as a metallic coating or paint and/or a metal layer or component that functions as an electromagnetic shielding component. In some examples, the metal layer and/or coating may include a metallic paint, such as a metallic paint comprising nickel, copper, silver, or other metals that may be bound with adhesives to adhere to the cover 120 such as on an interior surface of the cover 120. The coating may include vapor deposited metallic layers such as a copper-chrome-nickel vapor deposition layer or an aluminum vapor deposition layer. In some examples, the metallic layer may include a lacquer comprising a metal, such as a conductive copper lacquer. In some examples, the metallic layer may be plasma deposited or otherwise deposited on the cover 120, for example on an interior surface of the cover 120. In some examples, the metallic component for shielding may be suspended in and/or distributed through a plastic forming the cover 120. For instance, a thermoplastic may be injection molded to form the cover 120, and the thermoplastic may include granules, bits, or pieces of metals that will be distributed through the final cover to provide electromagnetic shielding. The metal layer may be sandwiched between layers of composites and/or adhered to a composite layer on one side such that the metal layer serves to shield components from electromagnetic interference.

The cover 120 further includes components for the cooling system 108 integrated into the cover 120 to enable cooling, either actively or passively, for the inverter 116. The cover 120 may include a heat sink and/or active cooling channels that are integrally formed with and/or pass through a portion of the cover 120. The heat sink may extend into the space enclosed by the case 118 and the cover 120 to contact one or more portions of the inverter 116. An opposite and/or distal end of the heat sink extends out through the cover 120 to radiate heat energy into an environment outside of the case 118. In some examples, the thermal pathway may include one or more active cooling channels integrally formed within the cover 120 such that cooling fluid may pass through the cover 120 to transfer heat from the inverter 116 to a destination outside of the enclosure, such as at a heat exchanger or radiator. As disclosed herein, the heat sink may be partially integrated into cover 120 and/or coupled to cover to form an electromagnetic shield around component(s) of a drive assembly 102. This may include various configurations of heat sink and cover 120 such that they can couple with minimal air gap between while still allowing the heat sink to pass through cover 120 and provide a thermal pathway therethrough.

In some examples, the cover 120 may include one or more additional components integrated therein, such as sensors to detect changes in temperature, pressure, electrical discharge, or other such events that may be identified and generate error codes or warnings for the vehicle system.

In some examples, one or more of the cooling systems 108 provide coolant to the inverter 116 and/or a cooling component coupled to the inverter 116. In some examples the first cooling system 108A and the second cooling system 108B may be separate systems that are not in fluid communication with one another. For example, the first cooling system 108A may provide coolant to the first drive assembly 102A from a first coolant circuit including a first coolant reservoir, and the second cooling system 108B may provide coolant to the second drive assembly 102B from a second coolant circuit including a second coolant reservoir.

In other examples, the first cooling system 108A may be in fluid communication with the second cooling system 108B. For instance, the first cooling system 108A may provide coolant to the first drive assembly 102A and the second drive assembly 102B from a common coolant circuit.

In some examples, the computer systems 122 control operation of one or more systems of the vehicle 100. For instance, in the case of an autonomous vehicle, the computer systems 122 may include one or more processor(s) 124 and memory 126 communicatively coupled with the one or more processor(s) 124 and may be configured to control the vehicle 100 to, among other things, receive and process sensor data from one or more sensors and to plan a route for the vehicle through an environment.

In the illustrated example, the vehicle 100 may be an autonomous vehicle; however, the vehicle 100 could be any other type of vehicle, such as a semi-autonomous vehicle, or any other system that includes one or more electrical components that may be enclosed within a case 118. Though depicted in FIG. 1 as residing in the body 104 for illustrative purposes, it is contemplated that the computer systems 122 be accessible to the vehicle 100 (e.g., stored on, or otherwise accessible by, memory remote from the vehicle 100, such as, for example, on memory of a remote computer device). In some examples, multiple computer systems 122 may be included on the vehicle 100. In some examples, computer systems 122 may be located within the body 104, a drive assembly 102, or combinations thereof.

The processor(s) 124 of the vehicle 100 may be any suitable processor capable of executing instructions to process data and perform operations as described herein. By way of example and not limitation, the processor(s) 124 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

Memory 126 is an example of non-transitory computer-readable media. Memory 126 may store an operating system and one or more software applications, instructions, programs, and/or data to implement the methods described herein and the functions attributed to the various systems. In various implementations, the memory may be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, memory 126 may include at least a working memory and a storage memory. For example, the working memory may be a high-speed memory of limited capacity (e.g., cache memory) that may be used for storing data to be operated on by the processor(s) 124. In some instances, memory 126 may include a storage memory that may be a lower-speed memory of relatively large capacity that may be used for long-term storage of data. In some cases, the processor(s) 124 cannot operate directly on data that may be stored in the storage memory, and data may need to be loaded into a working memory for performing operations based on the data, as discussed herein. In some examples, memory 126 may include instructions for operating the cooling systems 108 of the drive assemblies 102.

Figure 2:
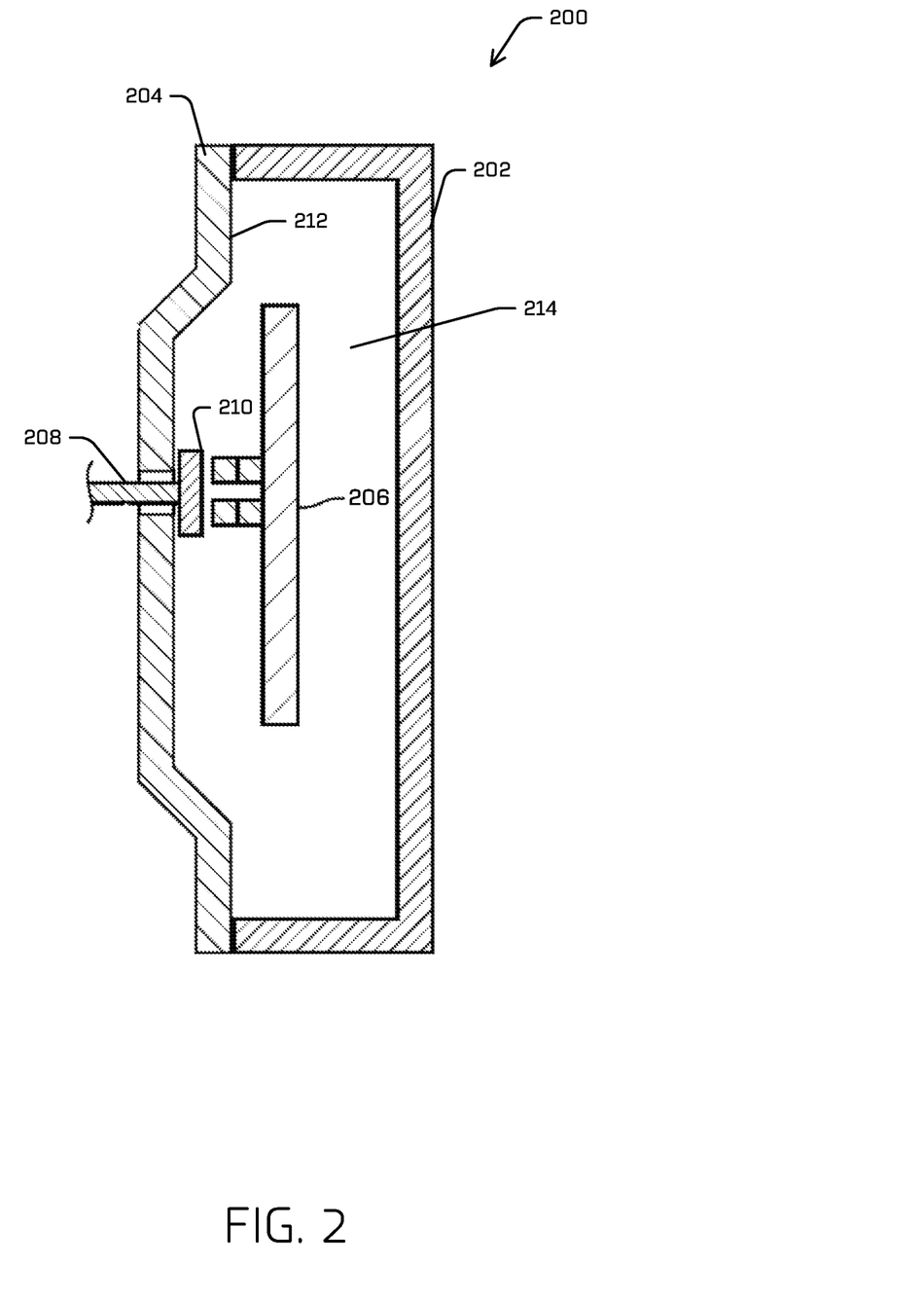
FIG. 2 illustrates an example cross-section of an electrical power unit using a composite cover, according to at least one example.

FIG. 2 illustrates an example cross-section of an electrical power unit 200 using a composite cover 204, according to at least one example. The electrical power unit 200 may be implemented in an environment where oscillations or vibrations are experienced by the electrical power unit 200 such as on a vehicle, within a factory setting, or other such environments. The electrical power unit 200 includes a case 202 that may be formed of any suitable material for enclosing a volume 214 to protect and/or isolate the electrical components 206 from a surrounding environment outside the volume 214. In some examples, the case 202 may be formed of or include a material that shields the electrical components 206 from external electromagnetic interference and prevents electromagnetic interference from the electrical components 206 from interfering with systems outside the case 202. In some examples, the case may include a metal or composite structure, including such as described with respect to the cover 204.

The cover 204 may be formed of a composite material, such as discussed with respect to cover 120 of FIG. 1 and may include a thermal pathway 208 that passes through the cover 204 from the electrical components at a proximal end 210 of the thermal pathway to an environment outside of the case 202. The cover 204 may also include a metallic shielding component on an inner surface 212. The metallic shielding may be undisturbed and undamaged by external forces by being positioned on the inner surface 212 and may provide electromagnetic shielding through the cover 204.

Figure 3:
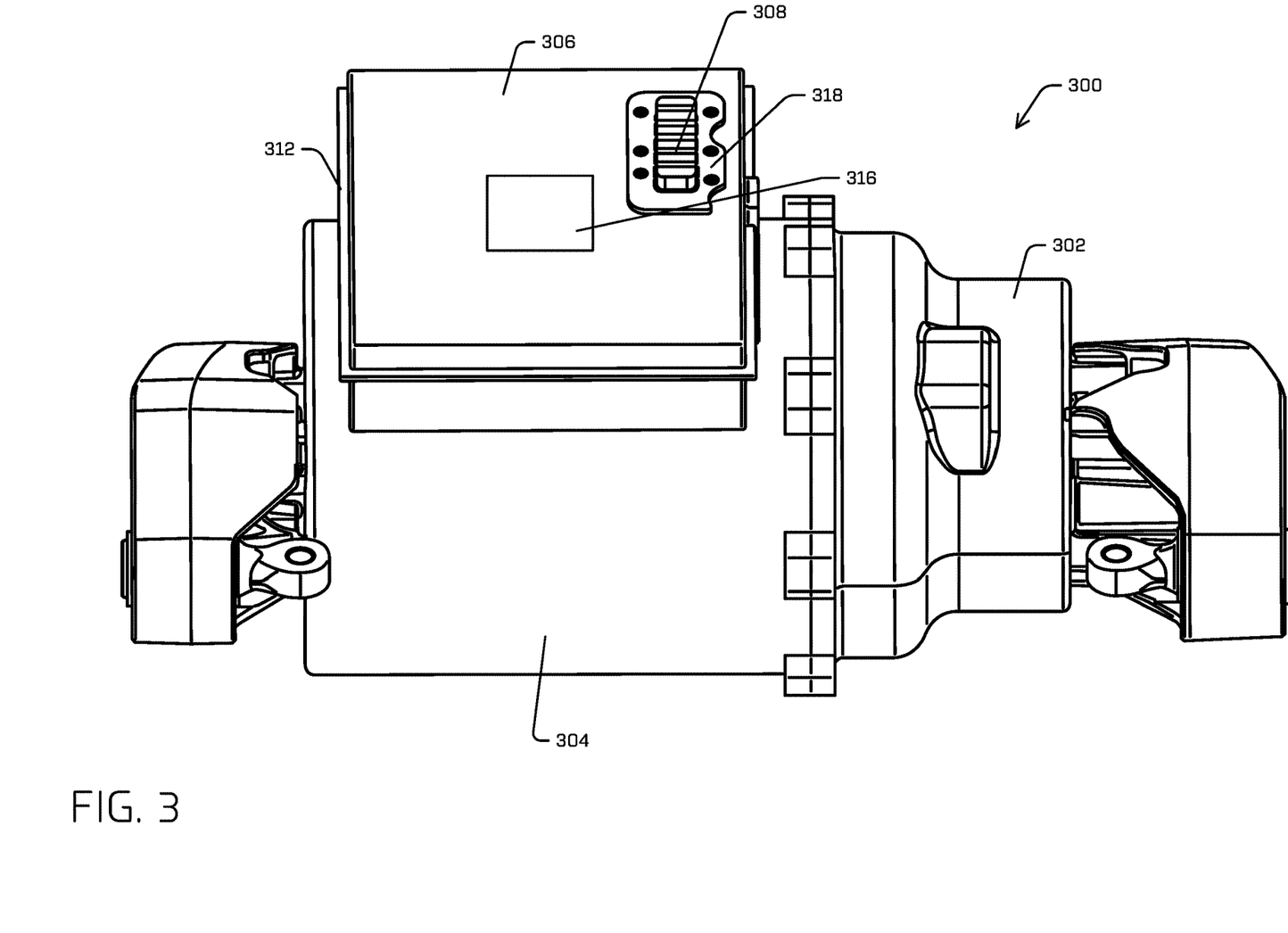
FIG. 3 illustrates an example drive assembly including a motor and inverter and having a composite cover for electronic components of the drive assembly, according to at least one example.
Figure 4:
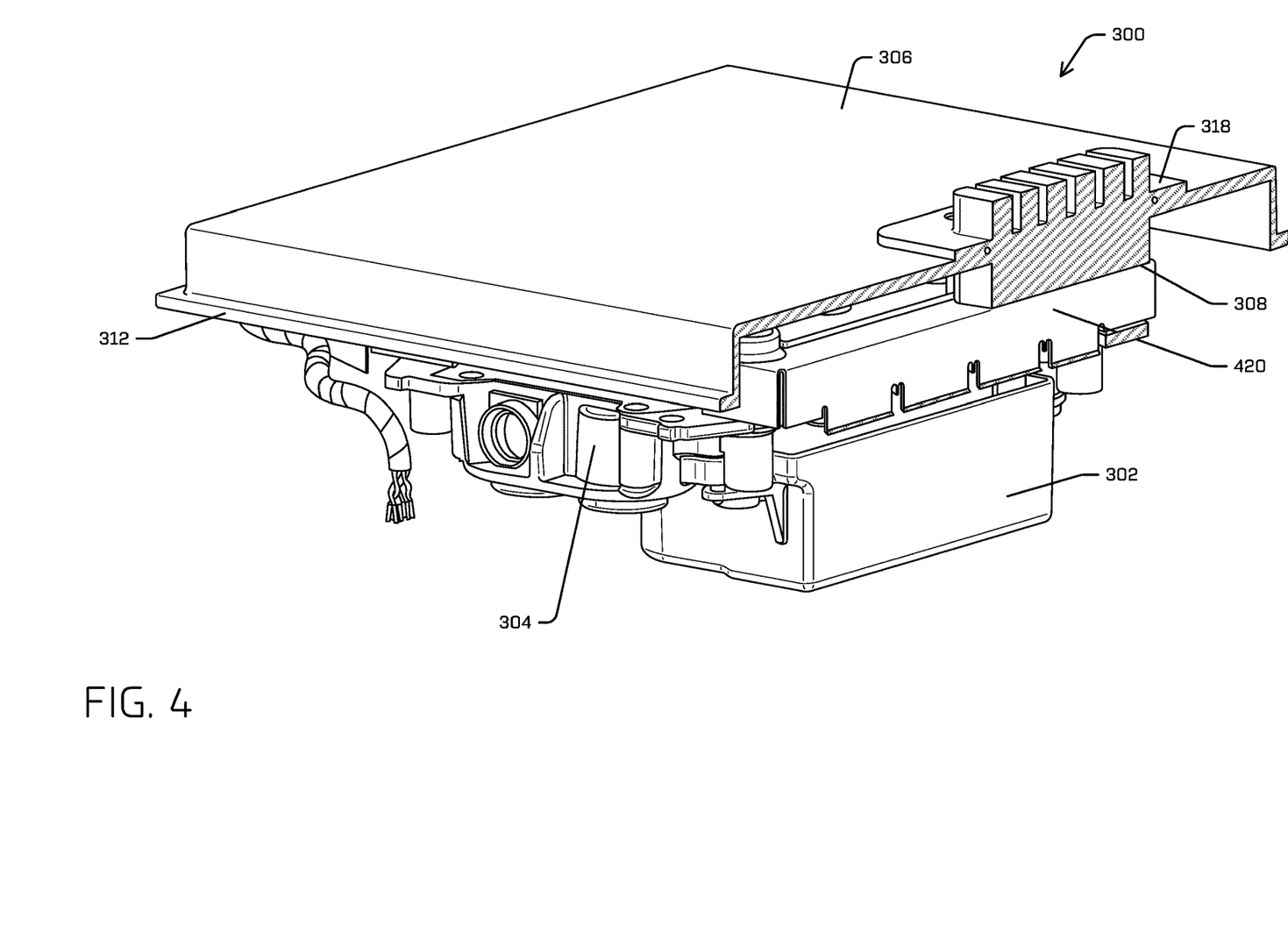
FIG. 4 illustrates a cross-section view of the example drive assembly of FIG. 3, according to at least one example.

FIGS. 3-4 illustrate an example drive assembly 300 including a motor 302 and inverter 420 and having a composite cover 306 for electronic components of the drive assembly 300, according to at least one example. The drive assembly 300 may receive power from a battery via an electrical connection to power the motor 302 and other components thereof. The drive assembly 300 includes a case 304 that may enclose at least the inverter 420 as well as additional electrical and/or mechanical elements such as a portion of the motor 302, electrical connections, resistor array, and other such components. In this manner, the case 304 protects the electrical components from the environment of the drive assembly 300, which may experience moisture, mud, dirt, debris, and other such disturbances.

The composite cover 306 may include structures such as ridges, fins, beams, ribs, fillets, supports, and other such structural elements to increase the stiffness of the composite cover 306. In some examples, the cover may have a corrugated shape or other such geometry to increase a stiffness of the composite cover 306 and thereby reduce the effects of vibration on the composite cover 306. The composite cover 306 may also include layers of various different materials for shielding, strength, and vibration damping. In an example, the composite cover may include a portion, such as a center portion 316, that may include a rubber material for vibration damping as the inclusion of such materials within the composite cover 306 may increase a damping ratio or coefficient for the composite cover 306. The composite cover 306 may include a flange 312 around a perimeter thereof that may be reinforced, for example with a reinforcing plate, support structure, or metal inserts around securing sections (e.g., mounting holes) to ensure the composite cover 306 may be securely fastened to the case 304. The flange 312 may include a gasket or other component that directly interfaces with the housing and provides electrical continuity from the metallic layer of the cover to the housing. The gasket, or other such intermediate material that is sandwiched between the cover and the housing may include an electrically conductive material.

The composite cover 306 further includes a heat sink 308 that passes through the composite cover 306 to enable cooling, either actively or passively, for circuitry and/or electrical components such as the inverter 420 within the case 304. The composite cover 306 includes the heat sink 308 to cool the electrical components through the composite cover 306, thereby overcoming a shortcoming of most composites, low thermal conductivity. The heat sink 308 may be integrally formed with and/or pass through a portion of the composite cover 306. For example, the heat sink 308 may be integrally formed or may be inserted with an interface 318 used to secure the heat sink 308 into the composite cover 306 and also in contact with the electrical components. The heat sink may extend into the space enclosed by the case 304 and the composite cover 306 to contact one or more heat-generating components of the electrical components. An opposite and/or distal end of the heat sink 308 extends out through the composite cover 306 to radiate heat energy into an environment outside of the case 304. The heat sink 308 may couple to the cover through a conductive medium, such as through a metal flange (e.g., interface 318) to provide continuous (e.g., complete) electromagnetic shielding on the interior surface of the cover. The heat sink 308 may be formed of a conductive material, such as a metal including aluminum, copper, magnesium, or other metals that may be used to transfer heat. The heat sink 308 and the interface 318 may be electrically coupled to the metallic layer such that the electromagnetic shielding covers the entirety of the interior of the composite cover. The heat sink 308 may include a thermal paste that contacts one or more electrical components within the housing such that when assembled, the heat sink 308 contacts the electrical components through a thermally conductive material. In some examples, the thermal paste may fill a gap between the heat sink 308 and the electrical components. Additionally, the contact between the heat sink 308 and the electrical components may provide physical support for the cover that may assist in reducing vibrations and oscillations of the cover. The heat sink 308 may act as a supporting post to support a middle portion of the cover and thereby reduce vibrations and oscillations of the cover.

As disclosed herein a portion of heat sink 308 can be contoured and/or otherwise configured to form a tight coupling with composite cover 306. This may include having dedicated electromagnetic shielding surfaces for bonding heat sink 308 to cover 306 that may take the form of a lip (not shown) suitable for application of an electromagnetic gasket or sealer between them. These mating surfaces may also include one or more fasteners as disclosed herein. In some examples, composite cover 306 may include a heat sink portion (not shown) that may couple to heat sink 308 (forming a two-part heat sink). Advantageously, this may allow composite cover 306 to be monolithically constructed with a heat sink portion that lacks gaps for electromagnetic emissions to leak. Such a composite cover 306 may include heat dissipating features such as fins por similar on one side that would be externally facing composite cover 306 is mounted to case 304. In some examples, heat sink 308 may include heat dissipating features that protrude through opening(s) in composite cover 306 when composite cover 306 is mounted.

Figure 5:
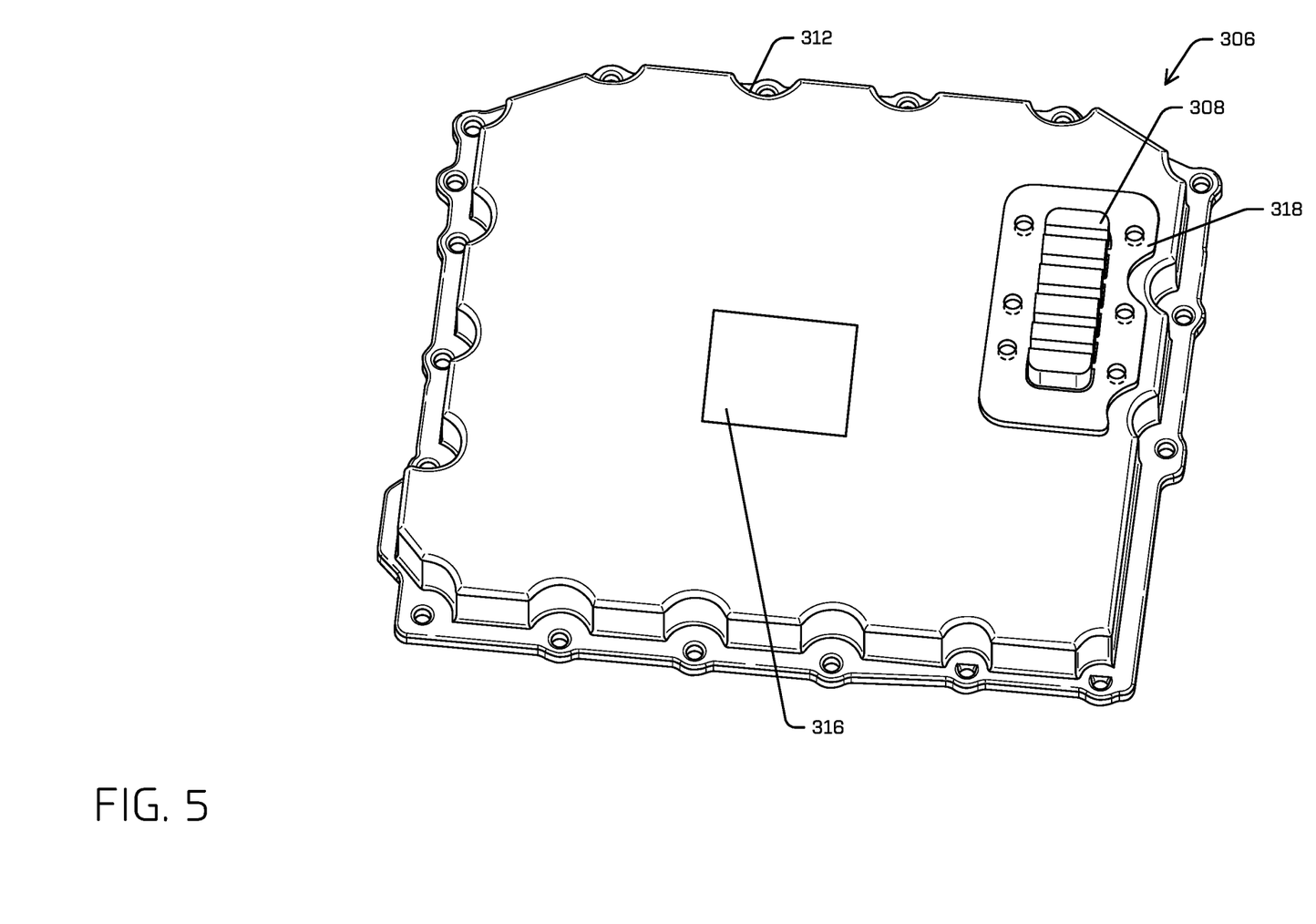
FIG. 5 illustrates a top view of an example composite cover for electronic components, according to at least one example.

FIG. 5 illustrates a top view of an example composite cover 306 for electronic components, according to at least one example. The composite cover 306 includes structures such as ridges, fins, beams, ribs, fillets, supports, and other such structural elements to increase the stiffness of the composite cover 306. In some examples, the cover may have a corrugated shape or other such geometry to increase a stiffness of the composite cover 306 and thereby reduce the effects of vibration on the composite cover 306. The composite cover 306 may also include layers of various different materials for shielding, strength, and vibration damping. In an example, the composite cover may include a portion, such as a center portion 316, that may include a rubber material for vibration damping as the inclusion of such materials within the composite cover 306 may increase a damping ratio or coefficient for the composite cover 306. The composite cover 306 may include a flange 312 around a perimeter thereof that may be reinforced, for example with a reinforcing plate, support structure, or metal inserts around securing sections (e.g., mounting holes) to ensure the composite cover 306 may be securely fastened to the case 304.

The composite cover 306 further includes the heat sink 308 that passes through the composite cover 306 to enable cooling, either actively or passively, for circuitry and/or electrical components such as the inverter 420 within the case 304. The composite cover 306 includes the heat sink 308 to cool the electrical components through the composite cover 306, thereby overcoming a shortcoming of most composites, low thermal conductivity. The heat sink 308 may be integrally formed with and/or pass through a portion of the composite cover 306. For example, the heat sink 308 may be integrally formed or may be inserted with an interface 318 used to secure the heat sink 308 into the composite cover 306 and also in contact with the electrical components. The heat sink may extend into the space enclosed by the case 304 and the composite cover 306 to contact one or more heat-generating components of the electrical components. An opposite and/or distal end of the heat sink 308 extends out through the composite cover 306 to radiate heat energy into an environment outside of the case 304

Figure 6:
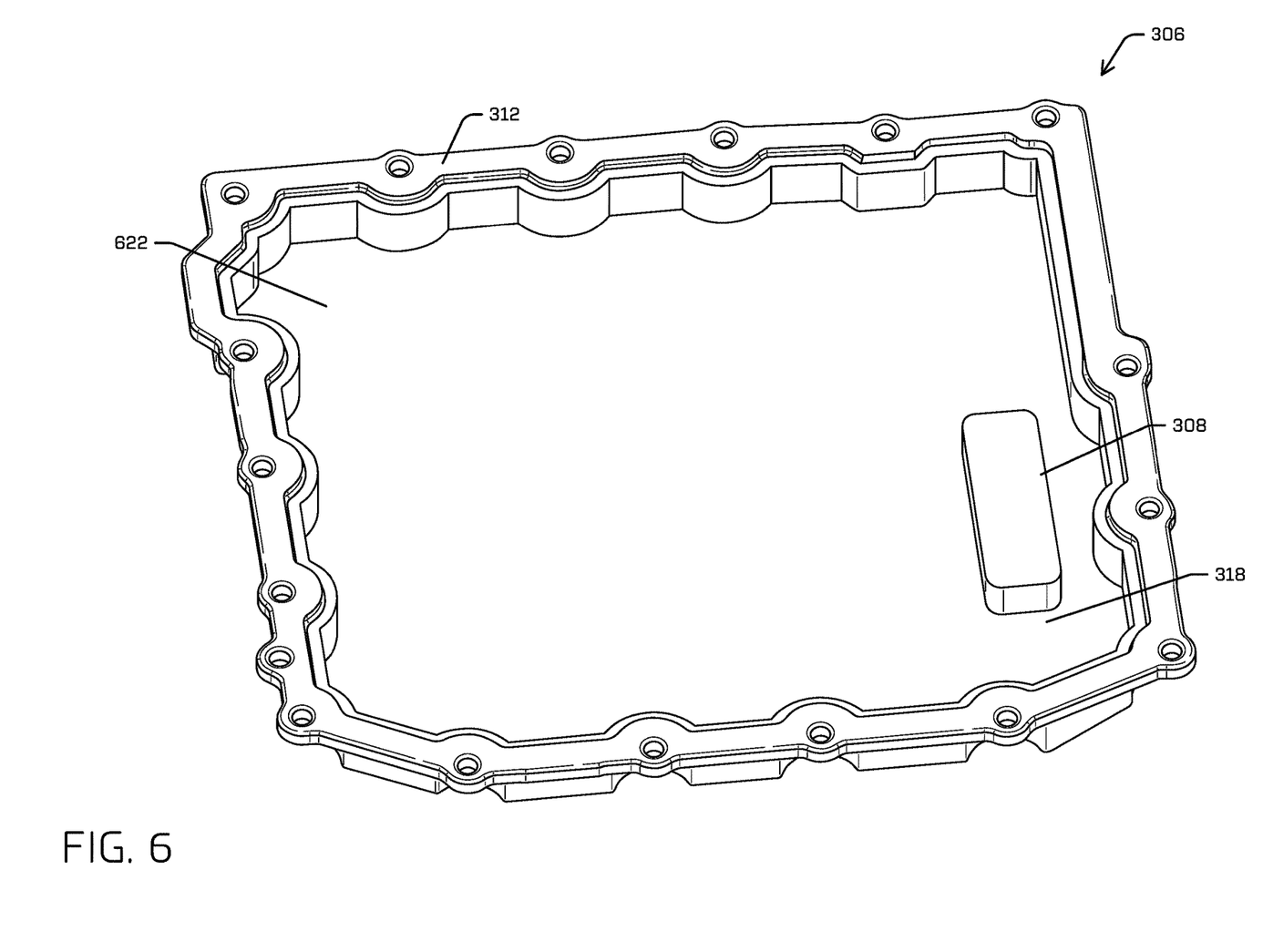
FIG. 6 illustrates a bottom view of the example composite cover of FIG. 5, according to at least one example.

FIG. 6 illustrates a bottom view of the example composite cover 306 of FIG. 5, according to at least one example. The bottom view shows an inner surface 622 that may include additional structures that may increase or provide stiffness to the composite cover 306. The inner surface 622 may include a metallic shielding, as described herein. The shielding may protect against electromagnetic and radio frequency interference. The composite cover 306 may include a metallic coating or paint and/or a metal layer or component that functions as an electromagnetic shielding component on the inner surface 622. In some examples, the metal layer and/or coating may include a metallic paint, such as a metallic paint comprising nickel, copper, silver, or other metals that may be bound with adhesives to adhere to the cover. The coating may include vapor deposited metallic layers such as a copper-chrome-nickel vapor deposition layer or an aluminum vapor deposition layer. In some examples, the metallic layer may include a lacquer comprising a metal, such as a conductive copper lacquer. In some examples, the metallic layer may be plasma deposited or otherwise deposited on the cover, for example on an interior surface of the cover. In some examples, the metallic component for shielding may be suspended in and/or distributed through a plastic forming the composite cover. For instance, a thermoplastic may be injection molded to form the cover, and the thermoplastic may include granules, bits, or pieces of metals that will be distributed through the final cover to provide electromagnetic shielding. The metal layer may be sandwiched between layers of composites and/or adhered to a composite layer on one side such that the metal layer serves to shield components from electromagnetic interference.

Figure 7:
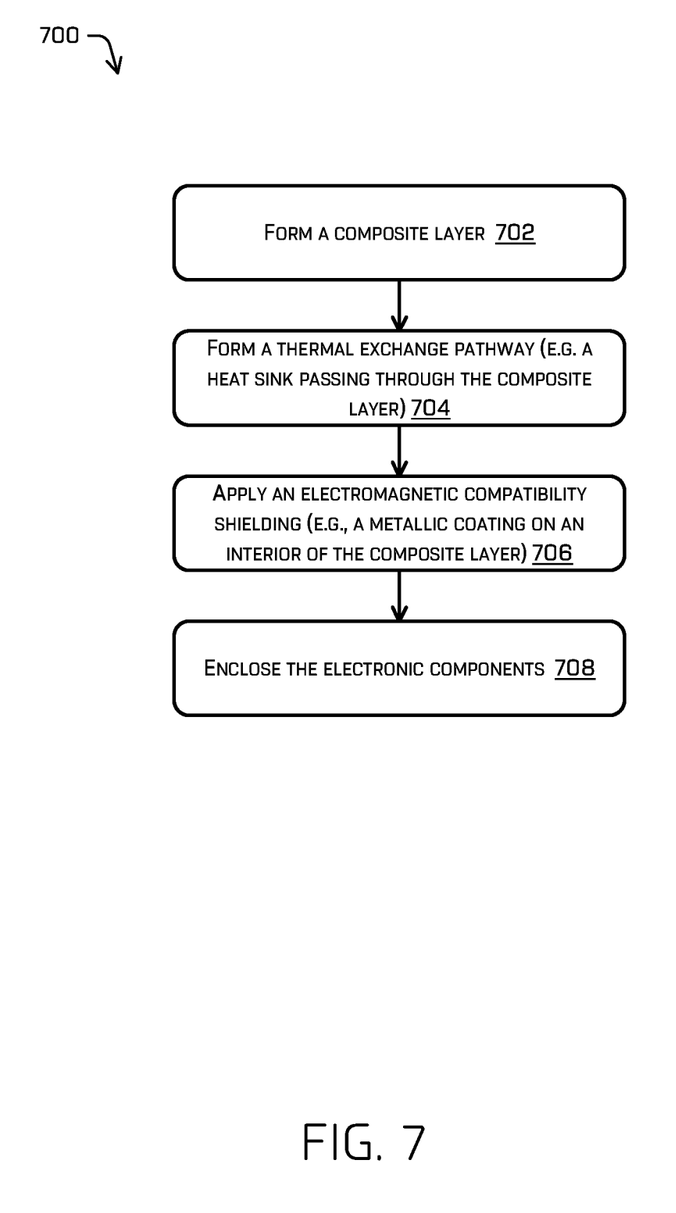
FIG. 7 illustrates a process for manufacturing a composite cover for an electronics component and enclosing the electronics component, according to at least one example.

By way of example, the process shown in FIG. 7 is illustrated as a logical flow diagram, each operation of which represents a sequence of operations that may be implemented using one or more systems or techniques, such as described herein. The order in which the operations are described is not intended to be construed as a limitation, and any number of the described operations can be combined (or omitted) in any order and/or in parallel to implement the process 700.

FIG. 7 illustrates a process 700 for manufacturing a composite cover for an electronics component and enclosing the electronics component, according to at least one example.

At 702, the process 700 includes forming a composite layer. The composite layer may be formed of a plastic or other material and may be formed through injection molding to form the composite layer into a shape for a cover of an enclosure for one or more electrical components, such as described herein.

At 704, the process 700 includes forming a thermal exchange pathway. The thermal exchange pathway may include a heat sink and/or active cooling channel integrally formed within the composite layer. In some examples, the heat sink and/or cooling channel may be added to the composite cover after the composite layer is shaped into the shape for the cover, for example by forming an opening and securing the thermal exchange pathway within the opening.

At 706, the process 700 includes applying an electromagnetic compatibility shielding. In some examples, the shielding may include a paint, coating, or other such layer applied to a surface of the cover. in some examples, the composite layer may include a metal layer sandwiched between layers of a composite or plastic, the metal layer forming the shielding. In some examples, the shielding may be suspended within or integrally formed with the cover by injection molding or may be applied after the cover is formed, for example by painting, plating, coating, or otherwise applying the shielding.

At 708, the process 700 includes enclosing the electronic components within an enclosure. The enclosure may include a case that may be formed of a composite similar to the cover and/or may be formed of a different material such as a metal or other such material. The electronic components may be enclosed such that the thermal exchange pathway may be in thermal communication with the electronic components within the enclosure and configured to dissipate heat outside of the enclosure.

Example Clauses

A. A drive unit for an electric vehicle comprising: an electric motor; a power electronics unit configured to receive a first current from a battery and providing a second current to the electric motor; a housing that accommodates the power electronics unit; and a cover mechanically coupled to the housing that, when coupled to the housing encloses the power electronics unit within a sealed compartment, wherein the cover is formed of a composite material and comprises: a heat sink that thermally couples with one or more components of the power electronics unit and an environment outside of the sealed compartment; and an electromagnetic compatibility shielding disposed on a surface of the cover, the surface of the cover enclosed within the sealed compartment when the housing is coupled to the housing.

B. The drive unit of example A, wherein the electromagnetic compatibility shielding comprises a metallic coating applied on an inner surface of the cover.

C. The drive unit of any of examples A-B, wherein the heat sink passes through the cover that provides a thermal pathway through the cover, the thermal pathway having a lower thermal resistance than a second thermal pathway through the composite material.

D. The drive unit of any of examples A-C, further comprising an interface material disposed between the cover and the housing when the housing is coupled to the cover, the interface material comprising an electrically conductive material that electrically couples the cover and the housing.

E. The drive unit of any of examples A-D, wherein the cover further comprises a damping portion comprising a visco-elastic insert configured to reduce oscillations of the cover.

F. A vehicle drive unit of an electric vehicle comprising: a motor; a housing that accommodates an electronic component of the vehicle drive unit; and a cover that mechanically couples to the housing to enclose the electronic component, the cover formed of a composite material.

G. The vehicle drive unit of example F, wherein the cover comprises a thermal exchanger that passes through the cover and thermally couples with one or more components of the electronic component and an environment outside of a sealed compartment formed by the housing and the cover.

H. The vehicle drive unit of any of examples F-G, wherein the thermal exchanger passes through the cover that provides a thermal pathway through the cover, the thermal pathway having a lower thermal resistance than a second thermal pathway through the composite material.

I. The vehicle drive unit of any of examples F-H, wherein the thermal exchanger comprises one or more active cooling channels that enable coolant to pass through the cover to transport heat from the electronic component to an environment outside the cover.

J. The vehicle drive unit of any of examples F-I, further comprising an interface material disposed between the cover and the housing when the housing is coupled to the cover, the interface material comprising an electrically conductive material that electrically couples the cover and the housing.

K. The vehicle drive unit of any of examples F-J, wherein the cover further comprises a conductive layer applied to a first surface of the cover, the first surface of the cover facing the electronic component when the cover is coupled to the housing.

L. The vehicle drive unit of any of examples F-K, wherein the conductive layer comprises a metallic paint applied on an inner surface of the cover.

M. The vehicle drive unit of any of examples F-L, wherein the conductive layer comprises a metal layer adhered with a layer of the non-conductive material.

N. The vehicle drive unit of any of examples F-M, wherein the cover further comprises a heat exchanging portion monolithically integrated composed of a material with a lower thermal resistivity than the composite material.

O. The vehicle drive unit of any of examples F-N, wherein the cover further comprises a damping portion comprising a rubber insert configured to reduce oscillations of the cover.

P. A method of manufacturing a cover for an electronic component, the method comprising: forming a composite layer having a geometry configured to interface with a case to enclose the electronic component, the composite layer formed of a material having a first damping coefficient greater than a second damping coefficient of a metal; forming a thermal exchange pathway through the cover; and applying an electromagnetic compatibility shielding to the cover.

Q. The method of example P, wherein forming the composite layer comprises injection molding a geometry of the cover.

R. The method of any of examples P-Q, wherein forming the thermal exchange pathway comprises integrally forming a heat sink with the composite layer.

S. The method of any of examples P-R, wherein applying the electromagnetic compatibility shielding comprises applying a metallic coating to a surface of the cover.

T. The method of any of examples P-S, wherein applying the electromagnetic compatibility shielding to the cover comprises integrally forming a metallic layer with the composite layer.

While the example clauses described above are described with respect to one particular implementation, it should be understood that, in the context of this document, the content of the example clauses can also be implemented via a method, device, system, and/or another implementation.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples. It is to be understood that other examples can be used and that changes or alterations, such as structural changes, can be made. Such examples, changes or alterations are not necessarily departures from the scope with respect to the intended subject matter. While the steps herein can be presented in a certain order, in some cases the ordering can be changed so that certain inputs are provided at different times or in a different order without changing the function of the systems and methods described. The disclosed procedures could also be executed in different orders.

What is claimed is:

1. A drive unit for an electric vehicle comprising:
   an electric motor;
   a power electronics unit configured to receive a first current from a battery and providing a second current to the electric motor;
   a housing that accommodates the power electronics unit; and
   a cover mechanically coupled to the housing that, when coupled to the housing encloses the power electronics unit within a sealed compartment, wherein the cover is formed of a composite material and comprises:
   an electromagnetic compatibility shielding integrally disposed on a surface of the cover, the surface of the cover enclosed within the sealed compartment when the cover is coupled to the housing; and
   a heat sink that thermally couples with one or more components of the power electronics unit and an environment outside of the sealed compartment, wherein the heat sink comprises a flanged interface that is configured to provide continuous electromagnetic shielding on the surface of the cover.

2. The drive unit of claim 1, wherein the electromagnetic compatibility shielding comprises a metallic coating applied on an inner surface of the cover.

3. The drive unit of claim 1, wherein the heat sink passes through the cover that provides a thermal pathway through the cover, the thermal pathway having a lower thermal resistance than a second thermal pathway through the composite material.

4. The drive unit of claim 1, further comprising an interface material disposed between the cover and the housing when the housing is coupled to the cover, the interface material comprising an electrically conductive material that electrically couples the cover and the housing.

5. The drive unit of claim 1, wherein the cover further comprises a damping portion comprising a visco-elastic insert configured to reduce oscillations of the cover.

6. A vehicle drive unit of an electric vehicle comprising:
   a motor;
   a housing that accommodates an electronic component of the vehicle drive unit; and
   a cover that mechanically couples to the housing to enclose the electronic component, the cover formed of a composite material;
   an electromagnetic compatibility shielding integrally disposed on a surface of the cover, the surface of the cover enclosed within a sealed compartment formed by the cover and the housing; and
   a heat sink that thermally couples the electronic component and an environment outside the sealed compartment, wherein the heat sink comprises a flanged interface that is configured to provide continuous electromagnetic shielding on the surface of the cover.

7. The vehicle drive unit of claim 6, wherein the heat sink passes through the cover and thermally couples with one or more components of the electronic component and the environment outside the sealed compartment.

8. The vehicle drive unit of claim 7, wherein the heat sink provides a thermal pathway through the cover, the thermal pathway having a lower thermal resistance than a second thermal pathway through the composite material.

9. The vehicle drive unit of claim 6, further comprising an interface material disposed between the cover and the housing when the housing is coupled to the cover, the interface material comprising an electrically conductive material that electrically couples the cover and the housing.

10. The vehicle drive unit of claim 6, wherein the electromagnetic compatibility shielding comprises a conductive layer applied to the surface of the cover.

11. The vehicle drive unit of claim 10, wherein the conductive layer comprises a metallic paint applied on the surface of the cover.

12. The vehicle drive unit of claim 10, wherein the conductive layer comprises a metal layer adhered with a layer of the non-conductive composite material.

13. The vehicle drive unit of claim 6, wherein the heat sink is monolithically integrated with the cover and is composed of a material with a lower thermal resistivity than the composite material.

14. The vehicle drive unit of claim 6, wherein the cover further comprises a damping portion comprising a rubber insert configured to reduce oscillations of the cover.

15. A method of manufacturing a cover for an electronic component, the method comprising:
- forming a composite layer having a geometry configured to interface with a case to enclose the electronic component, the composite layer formed of a material having a first damping coefficient greater than a second damping coefficient of a metal;
- forming a thermal exchange pathway through the cover; and
- applying an electromagnetic compatibility shielding to the cover, the electromagnetic compatibility shielding integrally disposed on a surface of the cover, the surface of the cover configured to be enclosed within a sealed compartment when the cover is coupled to a housing, and
- wherein the thermal exchange pathway comprises a flanged interface that is configured to provide continuous electromagnetic shielding on the surface of the cover.

16. The method of claim 15, wherein forming the composite layer comprises injection molding a geometry of the cover.

17. The method of claim 16, wherein forming the thermal exchange pathway comprises integrally forming a heat sink with the composite layer.

18. The method of claim 15, wherein applying the electromagnetic compatibility shielding comprises applying a metallic coating to the surface of the cover.

19. The method of claim 15, wherein applying the electromagnetic compatibility shielding to the cover comprises integrally forming a metallic layer with the composite layer.

20. The drive unit of claim 1, wherein the electromagnetic compatibility shielding is suspended in the composite material and the heat sink is monolithically integrated with the composite material.

* * * * *